(12) United States Patent
Yui et al.

(10) Patent No.: US 6,466,301 B1
(45) Date of Patent: *Oct. 15, 2002

(54) TRANSFER APPARATUS AND TRANSFER METHOD

(75) Inventors: Yoshikiyo Yui, Utsunomiya; Masato Muraki, Inagi, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/487,314

(22) Filed: Jan. 19, 2000

(30) Foreign Application Priority Data

Jan. 25, 1999 (JP) .................................. 11-015902

(51) Int. Cl.[7] .................. G03B 27/42; G03B 27/52; G03B 27/32
(52) U.S. Cl. .................. 355/53; 355/55; 355/77
(58) Field of Search .................. 355/52–55, 67–77; 356/399–401; 250/491.1, 491.2, 492.22, 548

(56) References Cited

U.S. PATENT DOCUMENTS

| | | | | | |
|---|---|---|---|---|---|
| 5,331,371 A | * | 7/1994 | Mori et al. | ............... | 355/53 |
| 5,808,910 A | * | 9/1998 | Irie et al. | ............... | 364/559 |
| 5,854,671 A | * | 12/1998 | Nishi | ............... | 355/53 |
| 5,929,454 A | | 7/1999 | Muraki et al. | ............... | 250/491.1 |
| 5,965,895 A | * | 10/1999 | Satoh et al. | ............... | 250/491.1 |
| 5,973,766 A | * | 10/1999 | Matsuura et al. | ............... | 355/52 |

FOREIGN PATENT DOCUMENTS

JP  63-73520  4/1988

* cited by examiner

Primary Examiner—Russell Adams
Assistant Examiner—Henry Hung Nguyen
(74) Attorney, Agent, or Firm—Fitzpatrick, Cella, Harper & Scinto

(57) ABSTRACT

Alignment marks of partial transfer patterns on a transfer mask are measured. On the basis of these measured alignment marks, functions for determining the positions of the alignment marks and the scale magnification in the relative scanning direction are calculated. The start and end positions of transfer of the partial transfer patterns to an object of transfer are calculated, and the scale magnification for moving a mask stage is corrected. The mask stage and a wafer stage are moved to sequentially expose the partial transfer patterns.

41 Claims, 10 Drawing Sheets

FIG. 6
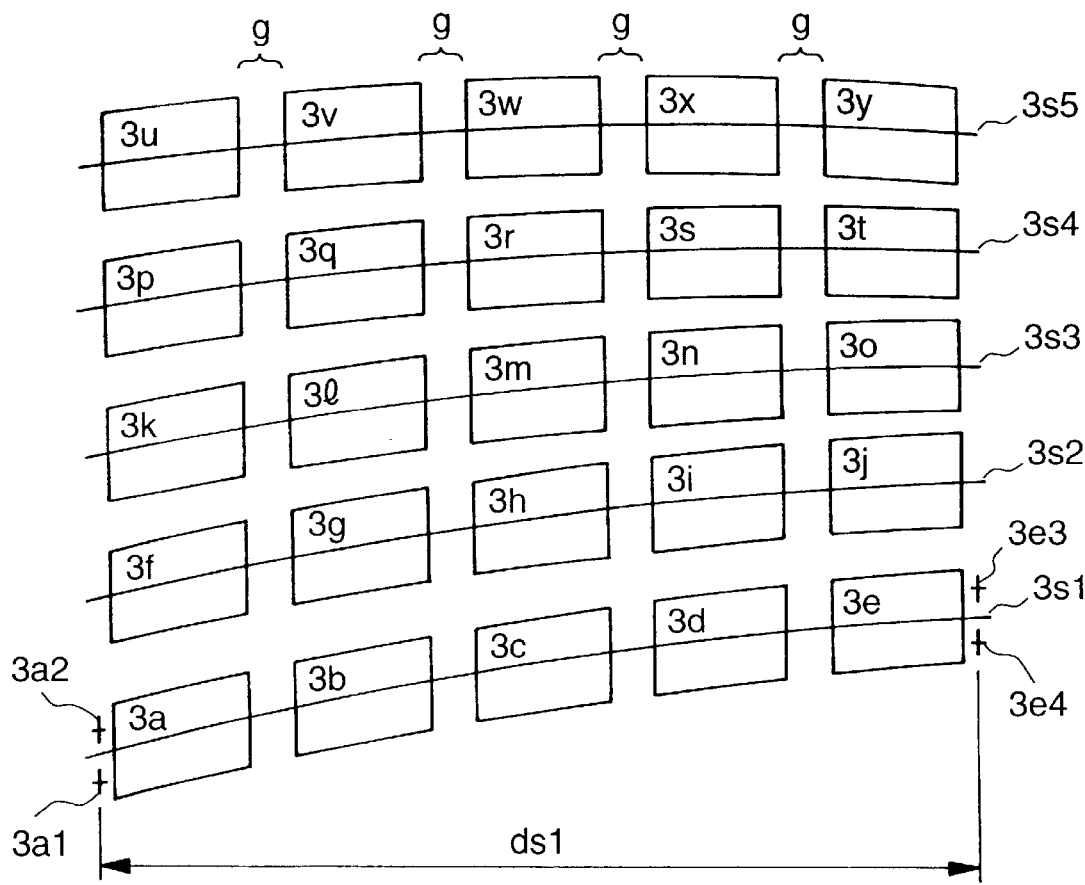
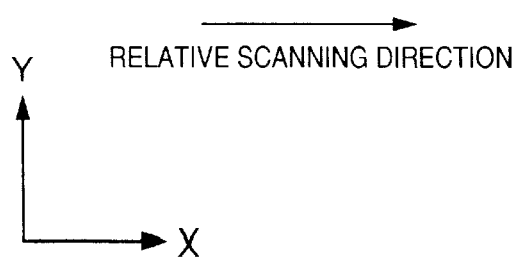
RELATIVE SCANNING DIRECTION

TRANSFER APPARATUS AND TRANSFER METHOD

BACKGROUND OF THE INVENTION

1. Field of the Invention

The present invention relates to a transfer apparatus and transfer method of fabricating a device by transferring an intricate pattern on a mask onto a substrate such as a wafer, a glass plate or the like.

2. Description of the Related Art

As the degree of integration of semiconductor devices increases and their performance and functions improve, the resolution and field angle of lithography apparatuses increase Also, the transfer method has changed from the wafer full method and the step-and-repeat method to the step-and-scan method. Under the circumstances, a scanning reduction transfer system using a transfer mask has been proposed for an exposure apparatus using a charged particle beam such as an electron beam, which is expected to further increase the resolution.

In apparatuses of this sort, however, the image performance significantly deteriorates when the field angle is increased, and the mask used has its structural limits. Therefore, a desired pattern is obtained by using a divided mask formed by dividing a transfer pattern into a plurality of patterns, and sequentially stitching together and transferring these divided patterns.

The divided mask is formed by arraying divided transfer patterns in predetermined positions on a single mask substrate.

In a transfer method using this divided mask, the stitching accuracy with which adjacent transfer patterns are stitched together is important. Hence, the divided transfer patterns must be arrayed with extremely high accuracy in predetermined positions on a mask. However, when this divided mask is formed by using, e.g., an electron beam lithography apparatus, the divided mask transfer patterns and their array may curve, or the size of each pattern may deviate from its designed value, depending on the method of lithography. Furthermore, errors are also produced by, e.g., strain due to temperature changes of the divided mask, strain due to mechanical stress, and strain due to changes with time. These errors degrade the aforementioned stitching accuracy, resulting in defects in a chip.

One known method of solving this problem is disclosed in Japanese Patent Laid-Open No. 63-73520. In this method, the position of a whole mask is obtained by using a dedicated mark, and a temporary coordinate system based on the data is used to drive a divided pattern to be exposed next to exposure position. After that, an alignment mark dedicated to each divided pattern is used to align each divided transfer pattern. This method is called a die-by-die method and can perform accurate alignment because it separately aligns individual divided patterns.

In the above method, however, each divided pattern is once driven by using a temporary coordinate system, and then an alignment mark dedicated to this divided pattern is used to align the divided transfer pattern. Hence, the measurement and driving for alignment are required whenever a divided pattern is transferred. The measurement time and driving time reduce the throughput of the entire apparatus. The influence that this problem has on the throughput increases as the number of divided patterns of a mask increases.

Also, the method disclosed in Japanese Patent Laid-Open No. 63-73520 cannot correct the curvature of a divided pattern resulting from the lithography method of a lithography apparatus used in the process of forming a divided mask described previously.

Furthermore, in the conventional transfer methods one chip can be transferred by at least one shot. In contrast, in this transfer method using a divided mask the time required to transfer one chip increases with the number of divided patterns of the mask. As an example, when one chip is divided into 5×10 matrix patterns and arranged on a mask, these divided patterns are sequentially transferred and stitched together, and exposure of the chip is not completed unless all these 50 divided patterns are completely transferred. If step-and-scan is simply repeated, the load is 50 times the number of scanning actions and 5 times or more the exposure time.

To save time for extreme acceleration, deceleration, and stoppage of the stage mounting wafers or masks, therefore, a system is possible which can transfer divided patterns at a higher speed by continuously moving the stage from one divided pattern to another without stopping it.

Unfortunately, the abovementioned die-by-die alignment method cannot be used to transfer divided patterns by continuously moving masks or wafers. This is so because, as described earlier, it is necessary to once position each divided pattern by using a temporary coordinate system and then align the divided transfer pattern by using an alignment mark dedicated to the divided pattern.

SUMMARY OF THE INVENTION

The present invention has been made in consideration of the above situation, and has as its object to provide a novel transfer apparatus, transfer method, and device fabrication method which improve the accuracy with which partial transfer patterns are stitched together and improve the throughput.

A transfer apparatus according to the present invention is a transfer apparatus for transferring a transfer pattern of a transfer mask while moving the transfer mask and a substrate relative to each other, the transfer pattern being divided into a plurality of partial transfer patterns, and the transfer mask having a plurality of alignment marks for specifying positions of the plurality of partial transfer patterns, comprising a measuring device for measuring all or some of the plurality of alignment marks, and a controller for determining a function indicating an arrangement of the plurality of partial transfer patterns on the basis of the measurements by the measuring device and, during transfer, moving a partial transfer mask to be transferred and the substrate relative to each other while aligning the transfer mask and the substrate in accordance with the function.

According to one preferred embodiment of the present invention, in the above transfer apparatus the controller preferably determines a function indicating an arrangement of partial transfer patterns belonging to each mask stripe composed of a plurality of partial transfer patterns arranged in a direction in which the transfer mask and the substrate are moved relative to each other.

According to another preferred embodiment of the present invention, in the above transfer apparatus the function is preferably a continuous function.

According to still another preferred embodiment of the present invention, in the above transfer apparatus the controller preferably comprises calculating means for calculating a ratio of a size of an actual transfer pattern to a size of a designed transfer pattern on the basis of the measurements by the measuring device, and correcting means for correcting a difference of the size of the actual transfer pattern from the size of the designed transfer pattern, when the transfer mask and the substrate are moved relative to each other, on the basis of the calculation by the calculating means.

According to still another preferred embodiment of the present invention, in the above transfer apparatus the calculating means preferably calculates a ratio of a length of the actual transfer pattern to a length of the designed transfer pattern in the direction in which the transfer mask and the substrate are moved relative to each other.

According to still another preferred embodiment of the present invention, in the above transfer apparatus the correcting means preferably adjusts a speed at which the transfer mask is moved on the basis of the calculated ratio, thereby correcting a difference of the length of the actual transfer pattern from the length of the designed transfer pattern.

According to still another preferred embodiment of the present invention, in the above transfer apparatus the calculating means preferably calculates a first ratio of a length of the actual transfer pattern to a length of the designed transfer pattern in a first direction in which the transfer mask and the substrate are moved relative to each other, and a second ratio of a length of the actual transfer pattern to a length of the designed transfer pattern in a second direction perpendicular to the first direction.

According to still another preferred embodiment of the present invention, in the above transfer apparatus the correcting means preferably corrects differences of the lengths of the actual transfer pattern from the lengths of the designed transfer pattern in the first and second directions on the basis of the first and second ratios.

According to still another preferred embodiment of the present invention, in the above transfer apparatus the controller preferably comprises calculating means for calculating a ratio of a size of an actual mask stripe, composed of a plurality of partial transfer patterns arranged in a direction in which the transfer mask and the substrate are moved relative to each other, to a size of a designed mask stripe, on the basis of the measurements by the measuring device, and correcting means for correcting a difference of the size of the actual mask stripe from the size of the designed mask stripe, when the transfer mask and the substrate are moved relative to each other, on the basis of the calculation by the calculating means.

According to still another preferred embodiment of the present invention, in the above transfer apparatus the calculating means preferably calculates a ratio of a length of the actual mask stripe to a length of the designed mask stripe in the direction in which the transfer mask and the substrate are moved relative to each other.

According to still another preferred embodiment of the present invention, in the above transfer apparatus the correcting means preferably adjusts a speed at which the transfer mask is moved on the basis of the calculated ratio, thereby correcting a difference of the length of the actual mask stripe from the length of the designed mask stripe.

According to still another preferred embodiment of the present invention, in the above transfer apparatus the calculating means preferably calculates a first ratio of a length of the actual mask stripe to a length of the designed mask stripe in a first direction in which the transfer mask and the substrate are moved relative to each other, and a second ratio of a length of the actual mask stripe to a length of the designed mask stripe in a second direction perpendicular to the first direction.

According to still another preferred embodiment of the present invention, in the above transfer apparatus the correcting means preferably corrects differences of the lengths of the actual mask stripe from the lengths of the designed mask stripe in the first and second directions on the basis of the first and second ratios.

According to still another preferred embodiment of the present invention, in the above transfer apparatus the controller preferably calculates a position of the transfer mask at the start of transfer on the basis of the function, and controls the position of the transfer mask on the basis of the calculation result.

According to still another preferred embodiment of the present invention, in the above transfer apparatus an operation of transferring a plurality of partial transfer patterns, belonging to each mask stripe composed of a plurality of partial transfer patterns arranged in a direction in which the transfer mask and the substrate are moved relative to each other, is preferably successively executed in units of mask stripes under the control of the controller.

According to still another preferred embodiment of the present invention, the above transfer apparatus preferably further comprises an irradiating unit for irradiating the transfer mask with a charged particle beam, a mask stage for mounting the transfer mask, a deflector or deflecting the charged particle beam passing through the transfer mask, and a substrate stage for mounting the substrate, wherein when a plurality of partial transfer patterns belonging to one mask stripe are to be successively transferred onto the substrate, the controller preferably continuously drives the mask stage and the substrate stage and controls the deflector such that an image transferred onto the substrate by using one partial transfer mask and an image transferred onto the substrate by using the next partial transfer mask are accurately stitched together.

According to still another preferred embodiment of the present invention, when in the above transfer apparatus a plurality of partial transfer patterns belonging to one mask stripe are to be successively transferred onto the substrate, the controller preferably linearly continuously drives the mask stage and the substrate stage and controls the deflector in accordance with the function.

According to still another preferred embodiment of the present invention, the above transfer apparatus preferably further comprises an irradiating unit for irradiating the transfer mask with a charged particle beam, a mask stage for mounting the transfer mask, a deflector for deflecting the charged particle beam passing through the transfer mask, and a substrate stage for mounting the substrate.

According to still another preferred embodiment of the present invention, in the above transfer apparatus the irradiating unit preferably irradiates the transfer mask with a charged particle beam shaped to have an arcuate section.

A transfer method according to the present invention is a transfer method of transferring a transfer pattern of a transfer mask while moving the transfer mask and a substrate relative to each other, the transfer pattern being divided into a plurality of partial transfer patterns, and the transfer mask having a plurality of alignment marks for specifying positions of the plurality of partial transfer patterns, comprising a measurement step of measuring all or some of the plurality of alignment marks, and a control step of determining a function indicating an arrangement of the plurality of partial transfer patterns on the basis of the measurements in the measurement step and, during transfer, moving a partial transfer mask to be transferred and the substrate relative to each other while aligning the transfer mask and the substrate in accordance with the function.

A device fabrication method according to the present invention is a device fabrication method in which a transfer method of transferring a transfer pattern of a transfer mask while moving the transfer mask and a substrate relative to each other is applied to a lithography step, wherein the transfer pattern is divided into a plurality of partial transfer patterns, and the transfer mask has a plurality of alignment marks for specifying positions of the plurality of partial transfer patterns, and the transfer method comprises a measurement step of measuring all or some of the plurality of alignment marks, and a control step of determining a function indicating an arrangement of the plurality of partial transfer patterns on the basis of the measurements in the measurement step and, during transfer, moving a partial transfer mask to be transferred and the substrate relative to each other while aligning the transfer mask and the substrate in accordance with the function.

Further objects, features and advantages of the present invention will become apparent from the following detailed description of embodiments of the present invention with reference to the accompanying drawings.

BRIEF DESCRIPTION OF THE DRAWINGS

FIG. 6 is a schematic view for explaining functions for determining the positions of mask shots in the present invention;

DETAILED DESCRIPTION OF THE PREFERRED EMBODIMENTS

Embodiments of the present invention will be described below with reference to the accompanying drawings.

First Embodiment

Figure 8:
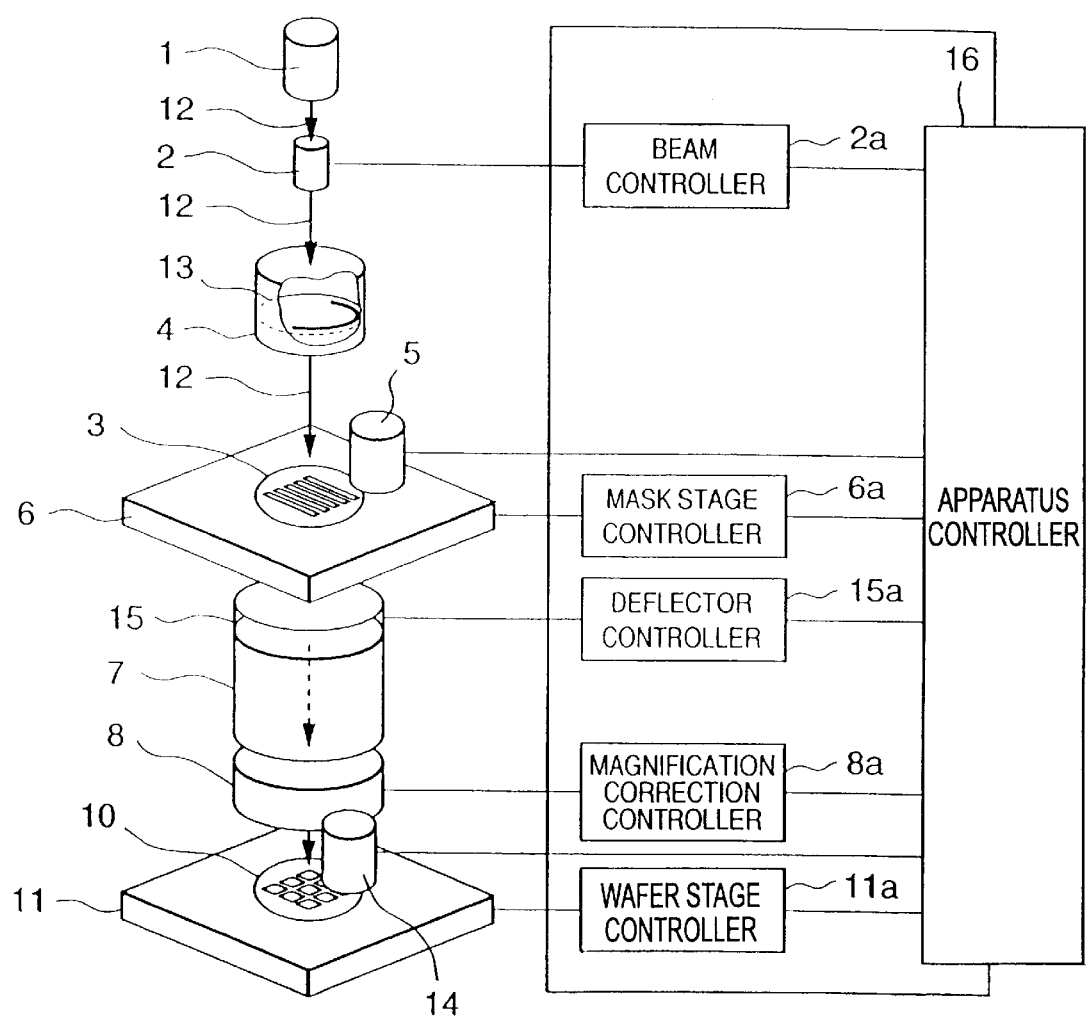
FIG. 8 is a schematic view showing the arrangement of an exposure apparatus for semiconductor device fabrication to which the transfer method of the present invention is applicable.

FIG. 8 is a schematic view showing the arrangement of an exposure apparatus for semiconductor device fabrication to which the transfer method of the present invention is applicable. The same apparatus is used in the second and third embodiments to be described later.

This exposure apparatus for semiconductor device fabrication is controlled by an apparatus controller 16. The apparatus controller 16 includes a beam controller 2a for controlling the dose of a beam 12 emitted from a beam source 1, a mask stage controller 6a for moving a mask stage, a deflector controller 15a for controlling a deflector 15, a magnification correction controller 8a for controlling a magnification correcting system 8, and a wafer stage controller 11a for moving a wafer stage 11. The magnification correcting system 8 corrects the magnification of a pattern of a transfer mask 3 to be projected onto a wafer 10.

The charged particle beam 12, such as an electron beam or an ion beam, emitted from the beam source 1 is fed into an illuminating system 4 while the beam controller 2a controls the dose by controlling ON/OFF of a beam control system 2. The charged particle beam 12 passes through the illuminating system 4 and irradiates the transfer mask 3 on the mask stage 6.

The illuminating system 4 contains a slit plate 13 having an arcuate slit. The charged particle beam 12 passing through this illuminating system 4 is so shaped as to form an arc in a plane perpendicular to the optical axis. By thus shaping the sectional shape of the charged particle beam into the form of an arc, it is possible to enlarge the exposure region while suppressing the image plane curvature to be negligible. In this embodiment, the charged particle beam 12 having the shape of an arc is used as described above. However, this beam shape can also be some other shape.

The mask stage 6 is driven by the mask stage controller 6a on the basis of a correction value measured and calculated by a mask alignment system 5, thereby aligning the transfer mask 3 with the transfer beam 12.

The charged particle beam 12 striking the transfer mask 3 and patterned by its pattern is deflected by the deflector 15 and projected by a projecting system 7. After the magnification correcting system 8 corrects the projection magnification, the charged particle beam 12 reaches the wafer 10 on the wafer stage 11 to thereby transfer the pattern of the transfer mask 3.

The wafer stage 11 controlled by the wafer stage controller 11a is driven by the wafer stage controller 11a on the basis of a value measured and calculated by a wafer alignment system 14, thereby aligning the wafer 10. Before transfer, the scan moving directions, perpendicularities, the pattern magnifications in a relative scanning direction, and the like of the mask stage 6 and the wafer stage 11 are matched. The obtained coordinate system is used as a reference coordinate system in all the subsequent steps.

An example in which the transfer method of the present invention is applied to the step of transferring the transfer mask 3 shown in FIG. 5A as a so-called first mask onto the wafer 10 will be described below.

Figure 5A:
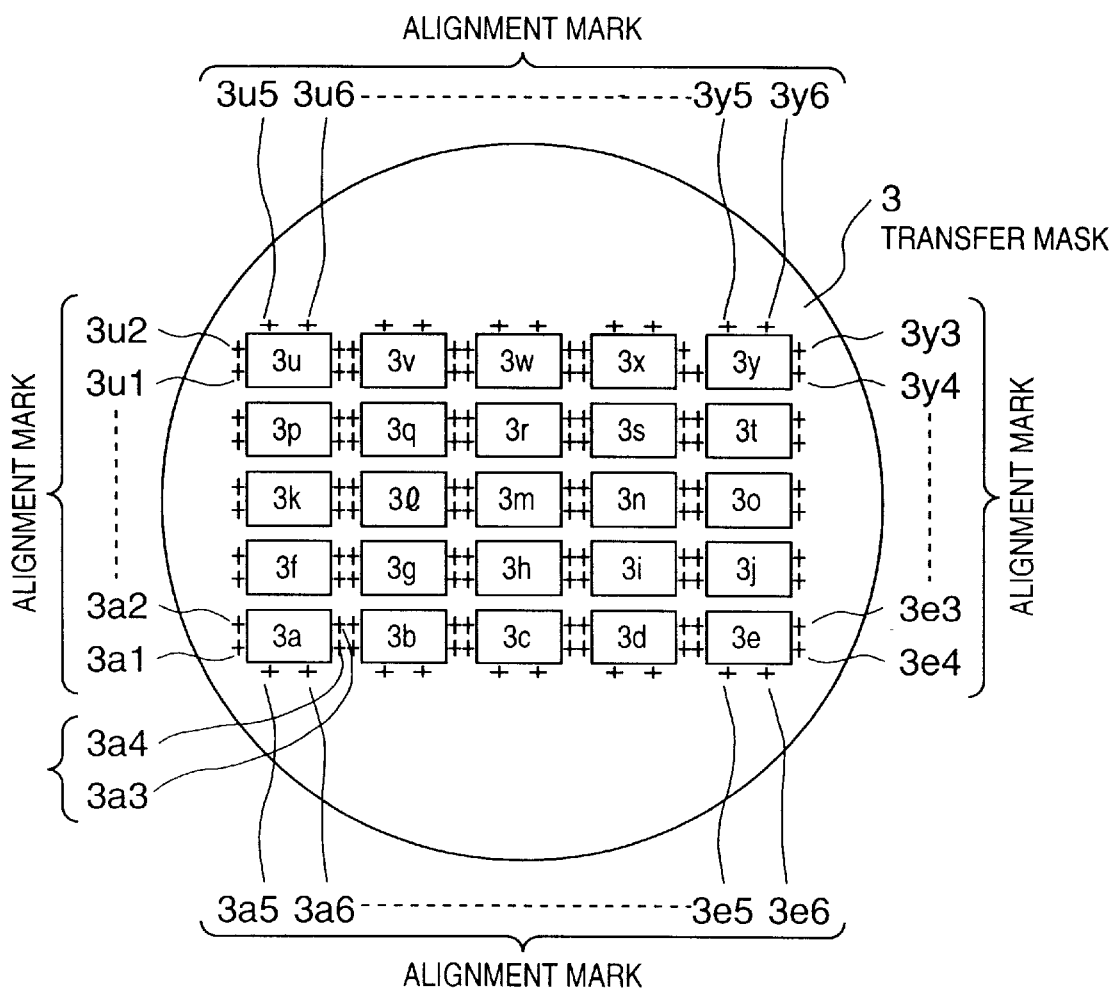
FIGS. 5A and 5B are schematic views for explaining mask shots and wafer shots according to the first to third embodiments.
Figure 5B:
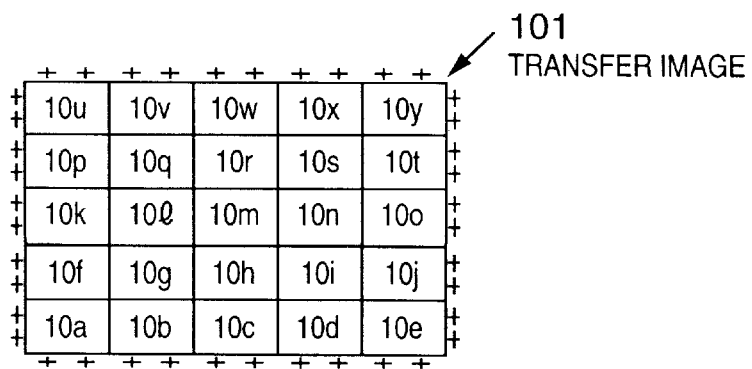

FIG. 5A shows the transfer mask 3 having 5×5 divided partial transfer patterns. FIG. 5B shows a transfer image 101 formed by transferring mask shots 3a to 3y, as the partial transfer patterns on the transfer mask 3 shown in FIG. 5A, onto the wafer 10.

These mask shots 3a to 3y are obtained by dividing a whole pattern corresponding to the transfer image 101 into a plurality of segments. Around the mask shots 3a to 3y on the transfer mask 3, alignment marks 3a1 to 3y6 for specifying the positions of the mask shots 3a to 3y on the transfer mask 3 are arranged.

For example, the position of the mask shot 3a is specified by the alignment marks 3a1 to 3a6. The mask shots 3a to 3y on the transfer mask 3 are sequentially transferred onto the wafer 10 with no gaps between them, such that the mask shot 3a is transferred to a wafer shot 10a on the wafer 10, the mask shot 3b to a wafer shot 10b, and so on, thereby forming a desired transfer image 101. At the same time, of the alignment marks of the mask shots 3a to 3e, 3f, 3j, 3k, 3o, 3p, 3t, and 3u to 3y, those on the perimeter of the whole transfer image, e.g., alignment marks 3a 1, 3a 2, 3a 5, and 3a6, are also transferred onto the wafer 10 and used in alignment of the second and subsequent layers.

Figure 1:
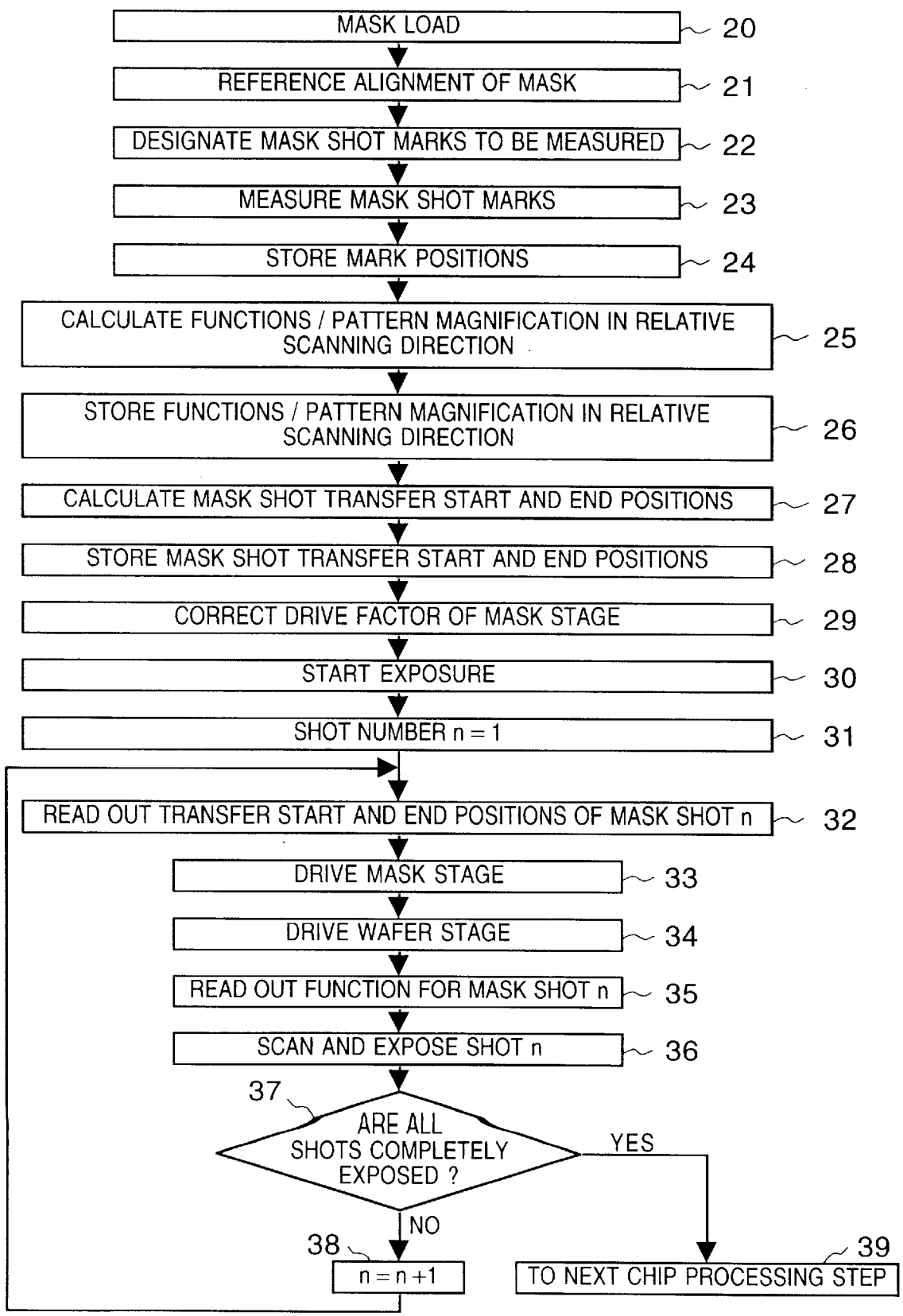
FIG. 1 is a flow chart for explaining a mask shot transfer method according to the first embodiment of the present invention.

FIG. 1 is a flow chart showing details of the aforementioned steps, i.e., is a basic flow of the present invention.

The transfer method of the present invention will be described below with reference to the flow chart shown in FIG. 1. Note that the wafer 10 is already loaded into the apparatus.

First, the transfer mask 3 is loaded onto the mask stage 6 (step 20). Next, the mask alignment system 5 measures the position of the transfer mask 3 and drives the mask stage 6 to perform reference alignment (step 21). The reference at this time is the reference coordinate system described above. The reference axis of the charged particle beam 12 and a separately provided apparatus reference are consistent with this reference coordinate system. Accordingly, this reference alignment aligns the transfer mask 3 with the reference axis of the charged particle beam 12 and with the separately provided apparatus reference.

When the transfer mask 3 is placed in the reference position, alignment marks to be used in measurement for alignment are designated (step 22). In this example, the alignment marks 3a1 to 3a4, 3c1 to 3c4, 3e1 to 3e4, 3f1 to 3f4, 3h1 to 3h4, 3j1 to 3j4, 3k1 to 3k4, 3m1 to 3m4, 3o1 to 3o4, 3p1 to 3p4, 3r1 to 3r4, 3t1 to 3t4, 3u1 to 3u4, 3w1 to 3w4, and 3y1 to 3y4 corresponding to the mask shots 3a, 3c, 3e, 3f, 3h, 3j, 3k, 3m, 3o, 3p, 3r, 3t, 3u, 3w, and 3y are designated. In this step, the alignment marks of all the mask shots can also be designated. However, the throughput of the apparatus lowers because the measurement time prolongs as the number of marks to be measured increases.

Next, the mask alignment system 5 measures the positions of the alignment marks 3a1 to 3a4, 3c1 to 3c4, 3e1 to 3e4, 3f1 to 3f4, 3h1 to 3h4, 3j1 to 3j4, 3k1 to 3k4, 3m1 to 3m4, 3o1 to 3o4, 3p1 to 3p4, 3r1 to 3r4, 3t1 to 3t4, 3u1 to 3u4, 3w1 to 3w4, and 3y1 to 3y4 corresponding to the mask shots 3a, 3c, 3e, 3f, 3h, 3j, 3k, 3m, 3o, 3p, 3r, 3t, 3u, 3w, and 3y on the transfer mask 3, designated in step 22 (step 23).

For the mask shot 3a, for example, the alignment marks 3a 5 and 3a6 can also be designated in addition to the alignment marks 3a1, 3a 2, 3a 3, and 3a4. However, the position of the mask shot 3a can be specified when the positions of the alignment marks 3a1 to 3a4 are known. So, these alignment marks 3a5 and 3a6 need not be designated.

After the positions of the alignment marks of the mask shots 3a, 3c, 3e, 3f, 3h, 3j, 3k, 3m, 3o, 3p, 3r, 3t, 3u, 3w, and 3y are measured, these positions of the alignment marks 3a1 to 3a4, 3c1 to 3c4, 3e1 to 3e4, 3f1 to 3f4, 3h1 to 3h4, 3j1 to 3j4, 3k1 to 3k4, 3m1 to 3m4, 3o1 to 3o4, 3p1 to 3p4, 3r1 to 3r4, 3t1 to 3t4, 3u1 to 3u4, 3w1 to 3w4, and 3y1 to 3y4 are individually stored (step 24).

The positions of the alignment marks 3a1 to 3a4, 3c1 to 3c4, 3e1 to 3e4, 3f1 to 3f4, 3h1 to 3h4, 3j1 to 3j4, 3k1 to 3k4, 3m1 to 3m4, 3o1 to 3o4, 3p1 to 3p4, 3r1 to 3r4, 3t1 to 3t4, 3u1 to 3u4, 3w1 to 3w4, and 3y1 to 3y4 stored in step 24 are then read out to calculate functions for determining the positions of the mask shots 3a to 3y (step 25).

FIG. 6 is a view showing the functions obtained from the position data of the alignment marks. This function is calculated for each stripe, so a function of a stripe constructed of, e.g., the mask shots 3a to 3e is calculated as 3s1. In a similar fashion, functions 3s2, 3s3, 3s4, and 3s5 are calculated for the mask shots 3f to 3j, 3k to 3o, 3p to 3t, and 3u to 3y, respectively.

These functions can be calculated by using any of various generally known methods, e.g., Nth-order function approximation, power function approximation, polynomial function approximation, and spline interpolation. It is also possible to evaluate the distances between a plurality of functions obtained by a plurality of these methods and an actual mark position by the method of error least squares or the like, and use a function best fitting the actual mark position.

Subsequently, mask stripe lengths are calculated to obtain the pattern magnification in the relative scanning direction. For example, the mean value of the distance in the relative scanning direction between the alignment mark 3a1 of the mask shot 3a and the alignment mark 3e4 of the mask shot 3e and the distance in the relative scanning direction of the alignment mark 3a 2 of the mask shot 3e and the alignment mark 3e3 of the mask shot 3e is calculated as a mask stripe length ds1. Analogously, mask stripe lengths ds2 to ds5 of the other mask stripes are calculated. A mean value dsm of these mask stripe lengths ds1 to ds5 is divided by a designed mask stripe length ds of the transfer mask 3 to obtain a value dsm/ds. This value dsm/ds is a pattern magnification Smm in the relative scanning direction as a first pattern magnification.

The functions 3s1 to 3s5 of the individual stripes and the pattern magnification Smm in the relative scanning direction calculated as above are stored (step 26).

In the steps up to this point, the functions for the individual mask stripes and the pattern magnification in the relative scanning direction of the transfer mask 3 are determined and stored. In the subsequent steps, on the basis of the functions calculated in step 25 the transfer start position of each mask shot is determined to proceed on to an actual exposure process.

From the alignment mark positions of the mask shots stored in step 24 and the functions calculated in step 25, the transfer start position and transfer end position of each mask shot are calculated (step 27).

Various methods can be used to calculate the transfer start position of each mask shot. For the mask shot 3a, for example, a mean value (A) of the actual positions in the relative scanning direction (i.e., the x coordinate) of the alignment marks 3a1 and 3a2 is added to the product of a designed offset value (B), from the mean position of the alignment marks 3a1 and 3a2 to the transfer start position, and the pattern magnification Smm in the relative scanning direction calculated in step 25. This sum (A+B×Smm) is the x coordinate of the transfer start position. The x coordinate of the transfer end position can be calculated in a similar way.

If all the mask shots are designated in step 22, the abovementioned processing is performed for all the mask shots to calculate their transfer start positions. If not all the mask shots are designated in step 22 as in this embodiment, the transfer start and end positions of the mask shot 3b are calculated as follows. For example, the transfer start and end positions of the mask shot 3a are calculated following the above procedures. Following the same procedures, the transfer start and end positions of the mask shot 3c are calculated. After that, the middle point between the X coordinate of the transfer start position of the mask shot 3a and the x coordinate of the transfer start position of the mask shot 3c is calculated. The transfer end position is similarly calculated. The middle point is calculated because the designed position of the mask shot 3b is in the middle of the mask shots 3a and 3c.

The transfer start and end positions of the individual mask shots thus calculated are stored (step 28).

Next, the pattern magnification Smm in the relative scanning direction stored in step 26 is read out and set in the mask stage controller 6a as a drive factor which is a factor of the driving velocity in the x direction of the mask stage 6 (step 29).

When exposure is started (step 30), a mask shot number a is initialized to 1 (step 31), and the flow advances to the subsequent shot exposure.

If n=1, a mask shot to be transferred is the mask shot 3a. The first step of this loop is to read out the transfer start and end positions of the first mask shot 3a (step 32).

Subsequently, the mask stage 6 having x, y, and θ axes is driven to move the mask shot 3a to the readout transfer position (step 33). Simultaneously with this operation, the wafer stage 11 is driven (step 34) to move the wafer 10 to a position where the first mask shot 3a is to be transferred. The positions of these stages driven in steps 33 and 34 are the start positions of relative scanning.

Of the functions stored in step 26, the function of the mask stripe including this mask shot (if n=1, the function 3s1 of the mask stripe including the mask shot 3a) is read out (step 35). In this stage, exposure is prepared for this shot.

Next, the beam control system 2 is driven to irradiate the mask shot 3a with the charged particle beam 12 to start scanning the region of the wafer shot 10a on the wafer 10 by the charged particle beam passing through this mask shot 3a. The entire region of the mask shot 3a is transferred onto the wafer 10 by scanning the mask stage 6 and the wafer stage 11 relative to each other with the charged particle beam 12 (step 36). During this transfer, the mask stage 6 is driven from the transfer start position to the transfer end position such that the charged particle beam 12 traces the function (if n=1, the function 3s1) read out in step 35. This feature, i.e., the charged particle beam traces the function, is one characteristic feature of the present invention. With this feature it is possible to correct the curvature or strain which each mask shot has.

When this shot is completely exposed, whether all shots are completely exposed is checked (step 37). If not all the shots are completely exposed and so the next shot is to be exposed, 1 is added to the mask shot number n (step 38), and the flow returns to step 32.

This loop from step 32 to step 38 is repeated and, if all the mask shots 3a to 3y are completely processed, the flow leaves this loop and advances to the next chip processing step (step 39). In this way, one chip or a whole pattern is transferred onto the wafer 10. To transfer a plurality of chips onto the wafer 10, the procedure from step 31 to step 39 in the above flow is repeated the same number of times as the number of the chips.

As described above, some of the alignment marks corresponding to the partial transfer patterns on the transfer mask 3 are designated. From the positions of these designated alignment marks, the functions of the individual mask stripes are calculated. During transfer, the mask shots and the wafer shots are scanned relative to each other while the mask stage 6 and the wafer stage 11 are so driven that the charged particle beam 12 traces these functions. Consequently, the curvature or strain of each mask shot (partial transfer pattern) can be corrected. So, the transfer image 101 with high resolution can be obtained while the alignment time is reduced.

Second Embodiment

In this embodiment, the stitching accuracy of partial transfer patterns is further improved by correction using the pattern magnification in a direction perpendicular to a relative scanning direction of mask shots and wafer shots, i.e., in a y direction. This method is effective when there is a difference between the pattern magnification in the relative scanning direction of mask shots and the pattern magnification in the direction perpendicular to the relative scanning direction. The transfer method of this embodiment will be described below with reference to the mask shot layout shown in FIG. 5A used in the explanation of the first embodiment and flow charts shown in FIGS. 2 and 3.

Figure 2:
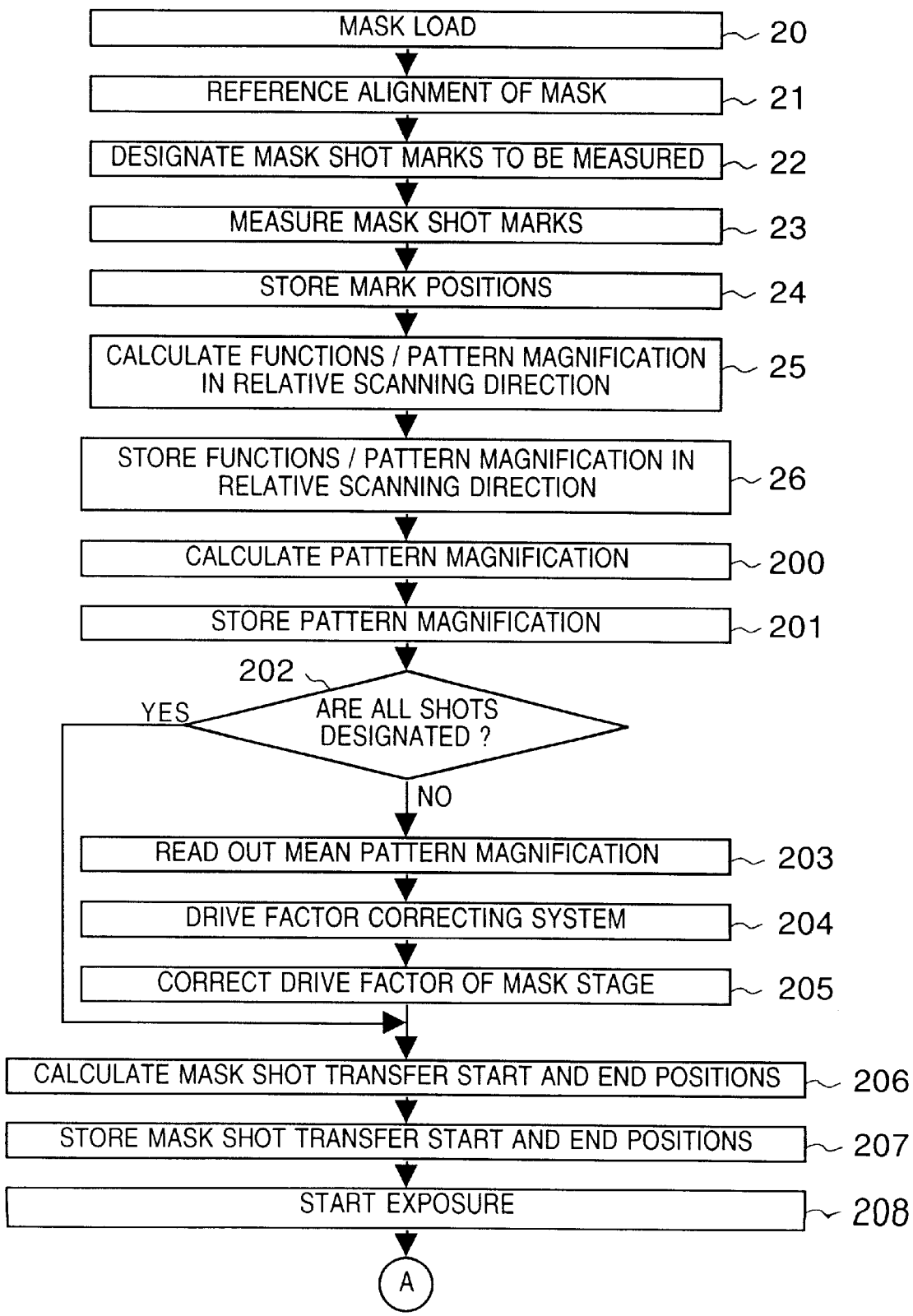
FIG. 2 is a flow chart for explaining a mask shot transfer method according to the second embodiment of the present invention.

Steps 20 to 26 in the flow chart of FIG. 2 are identical to the first embodiment described above. That is, the transfer mask shown in FIG. 5A is loaded into the apparatus and subjected to reference alignment, and designated alignment marks are measured. The alignment marks designated are the same as in the first embodiment. In this embodiment, however, as will be described later, the maximum effect can be obtained when all marks are designated. The positions of these alignment marks are calculated from the measurement results, and functions for individual mask stripes and a pattern magnification Smm in the relative scanning direction of a transfer mask 3 are calculated and stored (steps 23 to 26).

Next, the positions of the alignment marks stored in step 24 are read out to calculate a pattern magnification Mvn in the direction perpendicular to the relative scanning direction of the mask shots (step 200).

Figure 7:
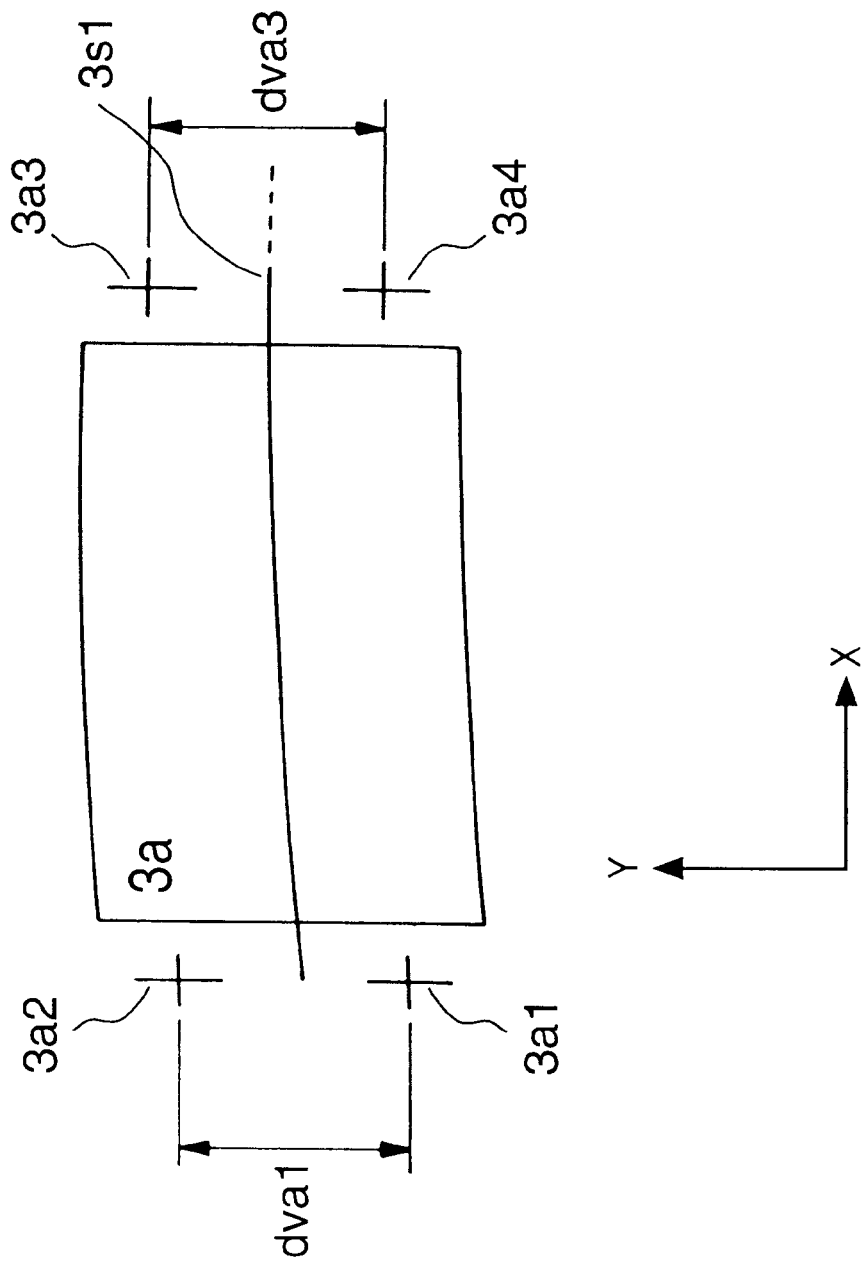
FIG. 7 is a schematic view for explaining the pattern magnification of a mask shot in the present invention.

This processing is as follows. For a mask shot 3a shown in FIG. 7, for example, let dva1 be the spacing between actual mark positions of alignment marks 3a1 and 3a2 and dva3 be the spacing between actual mark positions of alignment marks 3a3 and 3a4. The mean value of dva1 and dva3 is divided by a designed mark spacing Dvf to calculate (dva1+dva3)/2Dvf as a pattern magnification Mv1 in the direction perpendicular to the relative scanning direction. If not all the mask shots are designated in step 22, the mean value of pattern magnifications Mvn in the direction perpendicular to the relative scanning direction of the designated mask shots is calculated (step 200). This mean value is stored as a mean pattern magnification Mm in the direction perpendicular to the relative scanning direction of the mask shots (step 201). If all the mask shots are designated in step 22, the pattern magnifications Mvn in the direction perpendicular to the relative scanning direction of all the mask shots are stored as the second pattern magnifications (step 201).

Next, whether the measurement mark designation in step 22 is done for all the mask shots is checked (step 202). If YES in step 202, the flow skips steps 203 to 205; if not, the flow branches to execute step 203 for the following reason. That is, when the mean pattern magnification Mm in the direction perpendicular to the relative scanning direction of the mask shots is used, it is possible to previously drive a magnification correcting system 8 (step 204) and correct all the mask shots by the same amount.

On the other hand, if all the mask shots are designated in step 22, each mask shot can be corrected by a pattern magnification Mvb in the direction perpendicular to the relative scanning direction, which is optimum for that shot. If this is the case, the correction must be performed by driving the magnification correcting system 8 for each shot in a shot exposure loop (to be described later). Therefore, if all the mask shots are designated, steps 203 to 205 are skipped.

If all the mask shots are designated in step 22, the mean magnification Mm in the direction perpendicular to the relative scanning direction of the mask shots stored in step 201 is read out (step 203). The magnification correcting system 8 is driven to perform magnification correction for the mask shots on the basis of the read mean magnification Mm (step 204).

Subsequently, the pattern magnification Smm in the relative scanning direction stored in step 26 is divided by the mean pattern magnification Mm in the direction perpendicular to the relative scanning direction of the mask shots, thereby calculating a drive factor (Smm/Mm) as a factor of the driving velocity of the mask stage 6. This drive factor is set in a mask stage controller 6$a$ as the drive factor in the relative scanning direction of a mask stage 6 (step 205). The reason for this is that the magnification correcting system 8 in this embodiment corrects the magnification such that axial symmetry is obtained for the optical axis of the charged particle beam 12. If the magnification correction by the magnification correcting system 8 acts only in the direction perpendicular to the relative scanning direction, the pattern magnification Smm in the relative scanning direction can be directly used as the drive factor in the relative scanning direction of the mask stage 6.

After that, the transfer start and end positions of each mask shot are calculated (step 206) and stored (step 207), and a series of exposure processes are started (step 208), as in the first embodiment.

Figure 3:
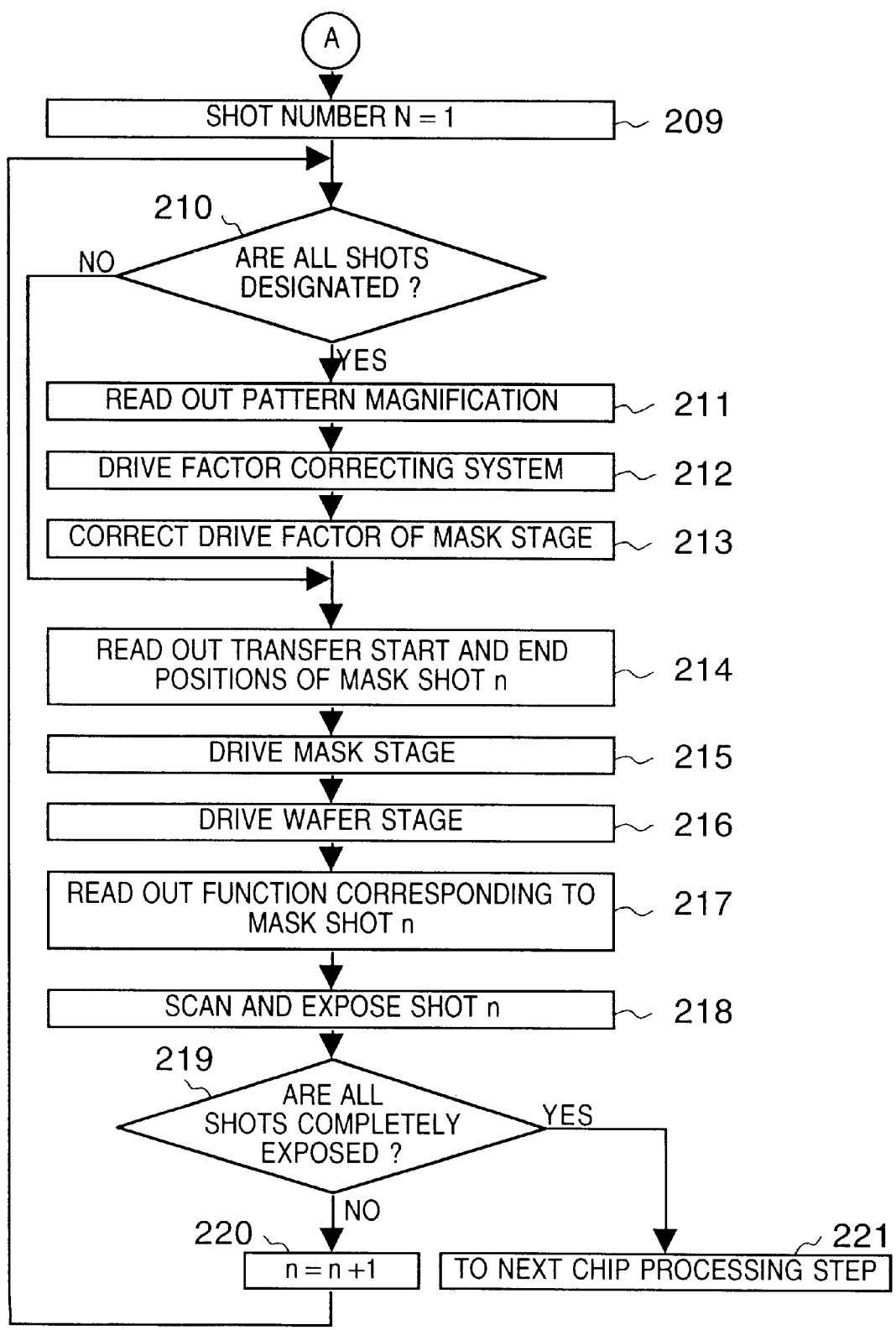
FIG. 3 is a flow chart for explaining the mask shot transfer method according to the first embodiment of the present invention.

Referring to FIG. 3, a mask shot number n is initialized to 1 (step 209) as in the first embodiment, and the flow advances to steps 210 to 220 as a shot exposure loop.

Next, whether the measurement mark designation is done for all the mask shots is checked (step 210).

If all the mask shots are designated in step S22, i.e., if the correction of the pattern magnification is to be performed for each mask shot, the pattern magnification Mvn in the direction perpendicular to the relative scanning direction of the mask shot stored in step 201 is read out (step 211). The magnification correcting system 8 is driven to correct the pattern magnification in the direction perpendicular to the relative scanning direction (step 212). Simultaneously, as the pattern magnification in the relative scanning direction of this shot, i.e., the drive factor of the mask stage 6, Smm/Mvn is set.

If not all the mask shots are designated in step 22, i.e., if the same correction amount is to be given to all the mask shots by using the mean pattern magnification Mm, steps 211 to 213 are skipped because in step 204 the magnification correcting system 8 is already driven on the basis of the mean pattern magnification Mm in the direction perpendicular to the relative scanning direction of the mask shots.

Steps 214 to 217 are the same as in the first embodiment. The transfer start and end positions of the mask shot are read out (step 214). The mask stage 6 is driven to the transfer start position (step 215). The wafer stage 11 is driven such that the transfer image of this mask shot comes to the transfer position on the mask 10 (step 216). The function of the mask stripe corresponding to the mask shot is read out (step 217) to prepare for the start of relative scanning exposure.

After that, relative scanning exposure is performed for the shot while the mask stage 6 is driven from the transfer start position to the transfer end position such that the charged particle beam traces the function (step 218). In this manner, the processing for one shot is completed.

The subsequent steps are the same as in the first embodiment. That is, the loop of steps 210 to 220 is repeated the same number of times as the number of shots, and whether all the shots are completely exposed is checked (step 219). If not all the shots are completely exposed and the next shot is to be exposed, 1 is added to the mask shot number n (step 220), and the flow returns to step 210. If all the shots are completely exposed, the flow advances to the next chip processing step (step 221).

In this embodiment as described above, correction also uses the pattern magnification in the direction perpendicular to the relative scanning direction of each shot. Accordingly, a transfer image 101 with higher stitching accuracy can be obtained.

As described above, in addition to the first embodiment, the pattern magnification in the direction perpendicular to the relative scanning direction of a partial transfer pattern is corrected. Consequently, the transfer image 101 with higher stitching accuracy can be obtained.

Third Embodiment

In the first and second embodiments, the present invention is applied to so-called step-and-scan by which a wafer is moved to the transfer start position of a partial transfer pattern and then the partial transfer pattern is exposed by relative scanning. In the third embodiment, each partial transfer pattern is transferred by continuously moving a mask stage 6 and a wafer stage 11, without stopping them, from one mask shot to another. This reduces time loss due to abrupt acceleration, deceleration, and stoppage of these mechanical stages having low response speed, thereby further improving the throughput of the whole apparatus. This embodiment also employs a method of correcting the pattern magnification in a direction perpendicular to the relative scanning direction and the pattern magnification in the relative scanning direction for each mask stripe. This improves the stitching accuracy.

The transfer method of this embodiment will be described below with reference to the mask shot layout in FIG. 5A and a flow chart shown in FIG. 4.

Figure 4:
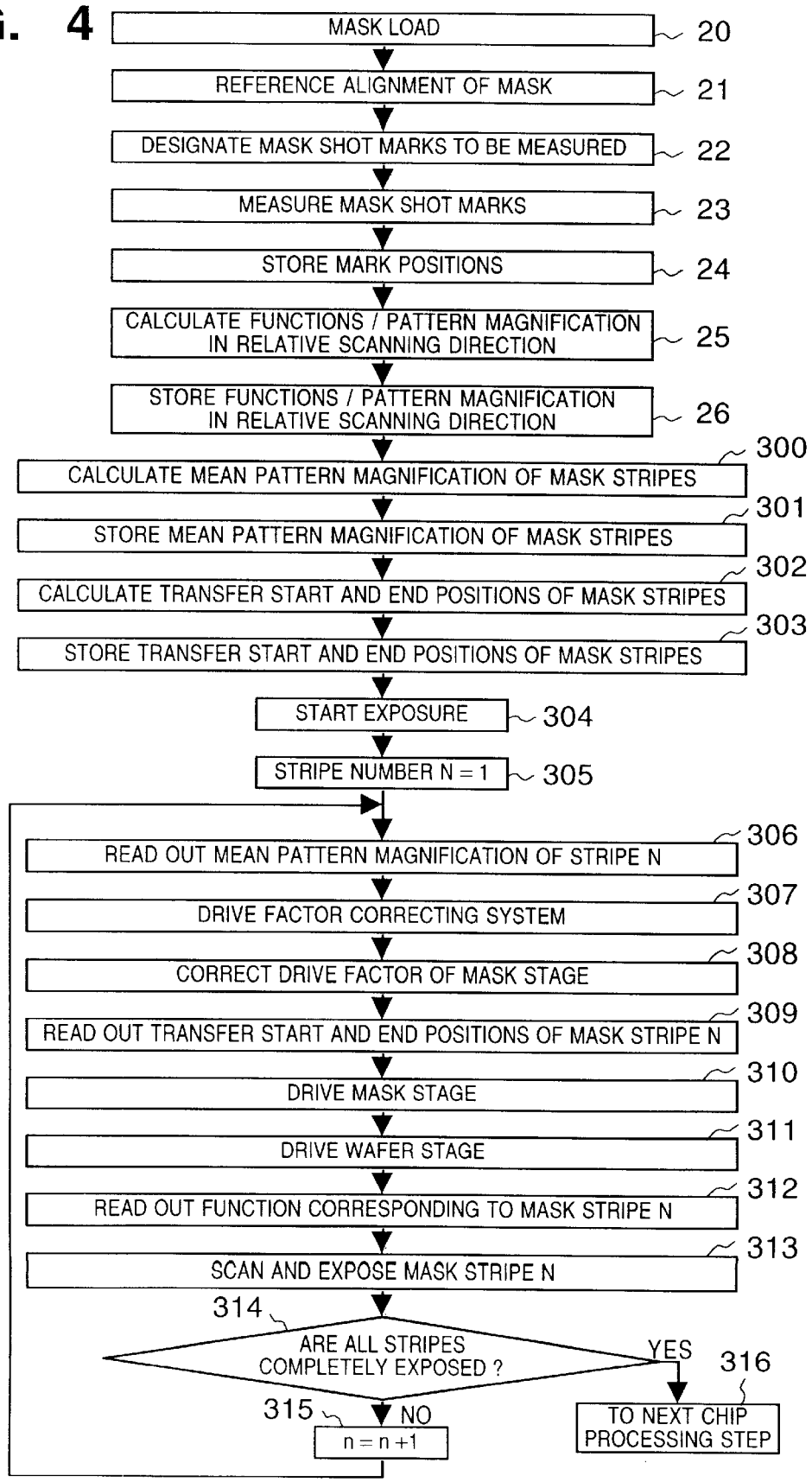
FIG. 4 is a flow chart for explaining a mask shot transfer method according to the third embodiment of the present invention.

Steps 20 to 26 of the flow chart in FIG. 4 are the same as in the aforementioned first embodiment. That is, a transfer mask 3 in FIG. 5A is loaded into the apparatus and subjected to reference alignment, and designated alignment marks are measured. Although the alignment marks designated are the same as in the first embodiment, all marks can also be designated. The positions of these alignment marks are calculated from the measurements, and functions 3$s$1 to 3$s$5 corresponding to individual mask stripes are calculated. In this embodiment, pattern magnifications Sm1 to Sm5 in the relative direction of these mask stripes are also calculated and stored together with the functions 3$s$1 to 3$s$5 (step 26).

Next, the positions of the alignment marks stored in step 24 are read out to calculate mean pattern magnifications Mm1 to Mm5 of the individual mask stripes (step 300) and store them in units of mask stripes (step 301). The method of calculating the pattern magnification of each mask shot is the same as in the second embodiment. Mm1 to Mm5 can be obtained by averaging the calculated pattern magnifications in units of mask stripes.

The transfer start position and transfer end position of each mask stripe are then calculated (step 302). For example, as the transfer start and end positions of a mask stripe including mask shots 3a to 3e, the transfer start position of the mask shot 3a and the transfer end position of the mask shot 3e, respectively, in the first embodiment are used. In this way, the transfer start and end positions of all the mask stripes are calculated and stored (step 303).

After that, a series of exposure processes are started (step 304). A mask stripe number N is initialized to 1 (step 305), and the flow advances to steps 306 to 315 as a stripe exposure loop.

Next, the mean pattern magnification MmN corresponding to the mask stripe N stored in step 301 is read out (step 306). A magnification correcting system 8 is driven to correct the pattern magnification in the -direction perpendicular to the relative scanning direction (step 307).

In addition, the pattern magnification SmN in the relative scanning direction of this mask stripe N stored in step 26 is read out, and, for the same reason as explained in the second embodiment, SmN/MmN is set as a drive factor which is a factor of the driving velocity of the mask stage 6 (step 308).

The transfer start and end positions of this mask stripe N stored in step 303 are read out (step 309) to move the mask stage 6 (step 310). At the same time, the wafer stage 11 is driven (step 311) to move a wafer 10 to the position where this mask stripe N is to be transferred. Furthermore, the function 3sN of this mask stripe N stored in step 26 is read out (step 312) to complete preparations for scanning exposure for the mask stripe N.

After that, relative scanning exposure is performed for the mask stripe N such that a charged particle beam 12 traces the function 3sN (step 313). In this embodiment, this relative scanning step is performed by using the mask stage 6, the wafer stage 11, and a deflector 15. That is, while the mask stage 6 and the wafer stage 11 are linearly driven relative to each other from the respective transfer start positions to transfer end positions, the function 3s1 is traced (deviation from the straight line is corrected) and a gap g between mask shots is skipped by driving the deflector 15.

This gap g between mask shots can be skipped by, e.g., the following method.

When the transfer of the mask shot 3a by relative scanning is completed and the mask shot 3b to be transferred next has arrived at the transfer start position, the transfer image of this mask shot 3b is moved along the function 3s1 by using the deflector 15 and stitched to the transfer pattern of the mask shot 3a, which is already transferred onto the wafer 10.

Diverse methods can be used for skipping in accordance with the number or arrangement of deflectors 15. However, the effect of exposing each mask shot by relative scanning while the charged particle beam traces the function is the same regardless of the type of method. In the way as described above, the processing for one stripe is completed.

The subsequent steps are as follows. The loop of steps 306 to 315 is repeated, and whether all the stripes are completely exposed is checked (step 314). If not all the stripes are completely exposed and the next stripe is to be exposed, 1 is added to the stripe number N (step 315), and the flow returns to step 306. When all the stripes are completely processed, the flow leaves this loop and advances to the next chip processing step (step 316).

As described above, each mask stripe is transferred by continuously moving the mask stage 6 and the wafer stage 11, without stopping them, from one mask shot to another. This reduces time loss due to abrupt acceleration, deceleration, and stoppage of each stage, so the throughput of the whole apparatus can be further improved. Also, the stitching accuracy can be improved by correcting the pattern magnification in the direction perpendicular to the relative scanning direction and the pattern magnification in the relative scanning direction.

Other Embodiments

In the first and second embodiments described previously, the position of a mask shot is corrected by driving the mask stage in accordance with a function.

However, since a mask and a wafer have a fixed relationship determined by the transfer system, similar correction can also be performed using the wafer stage instead of the mask stage. The shot stitching accuracy can be further improved by selecting either method in accordance with the function, performance, and driving accuracy of each stage.

The present invention is applicable to all transfer systems, e.g., an equal-magnification transfer system, a reduction projecting transfer system, a proximity transfer system, and a contact transfer system.

In the first to third embodiments, the present invention is applied to the so-called first layer. However, the same effect can be obtained even when the present invention is applied to the so-called second and subsequent layers. If this is the case, various methods used in conventional optical exposure apparatuses can be used as the method of aligning chips on a wafer. As an example, the global alignment method measures the arrangement of chips on a wafer and compares the measured arrangement with a theoretical arrangement, thereby correcting the coordinate system for this chip arrangement. The present invention can be applied while the wafer stage is set to be driven by using this corrected coordinate system.

Although the present invention is suitable for a transfer method using a charged particle beam, the present invention is also applicable to a transfer method using light.

Figure 9:
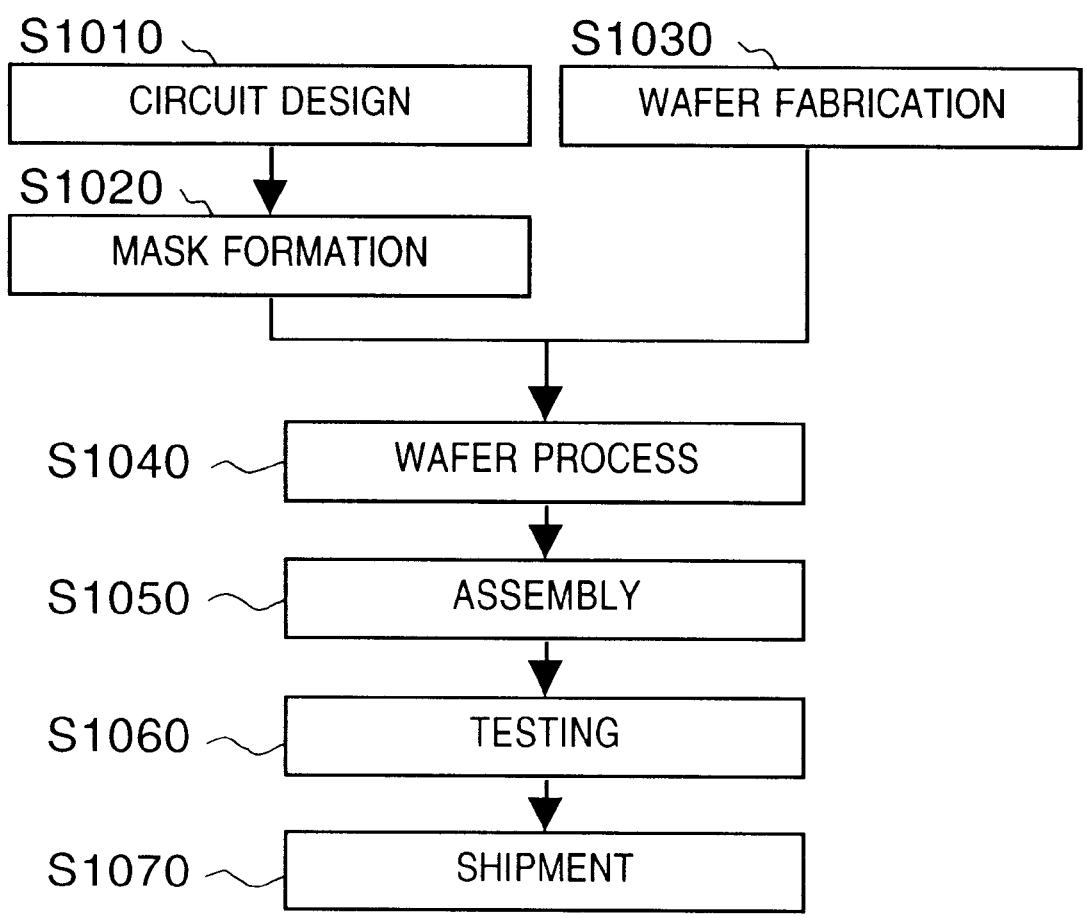
FIG. 9 is a flow chart showing device fabrication steps.
Figure 10:
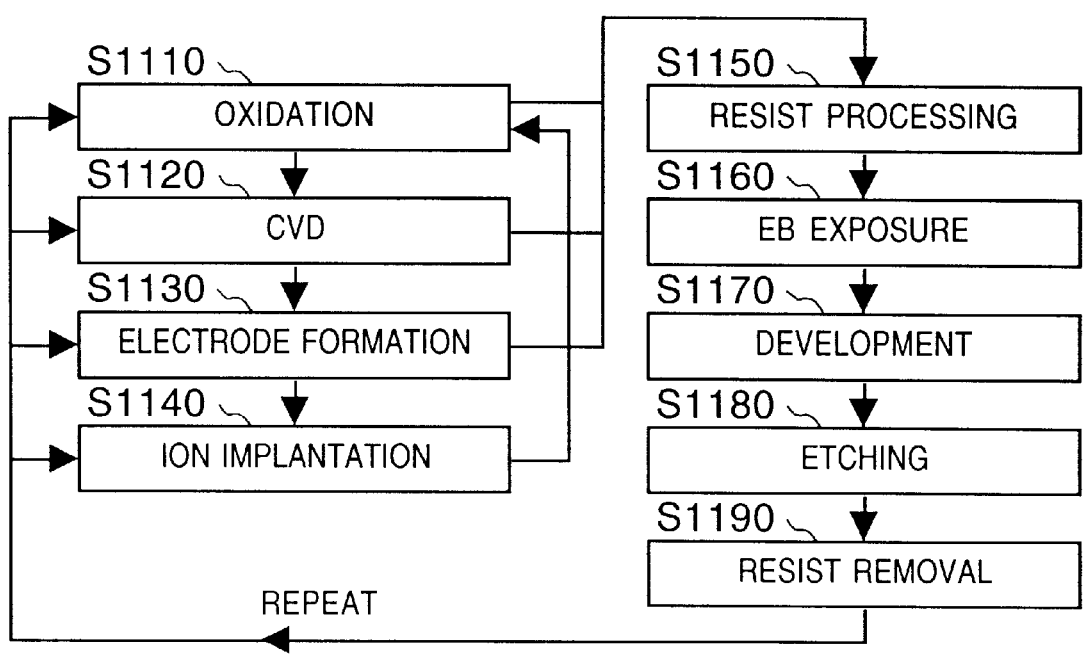
FIG. 10 is a flow chart showing detailed steps of a wafer process shown in FIG. 9.

One embodiment of a device fabrication method using the aforementioned mask pattern transfer method will be described below. FIG. 9 shows the fabrication flow of microdevices (e.g., semiconductor chips such as ICs or ISIs, liquid crystal panels, CCDs, thin-film magnetic heads, and micromachines). In step 1010 (circuit design), device pattern design is performed. In step 1020 (mask formation), a mask having the designed pattern is formed. In step 1030 (wafer fabrication), a wafer is fabricated by using a material such as silicon or glass. Step 1040 (wafer process) is called a pre-process in which actual circuits are formed on the wafer by lithography by using the prepared mask and wafer. Step 1050 (assembly) is called a post-process in which semiconductor chips are formed using the wafer fabricated in step 1040. This step 1050 includes an assembly step (dicing and bonding), a packaging step (chip encapsulation), and the like. In step 1060 (testing), the semiconductor devices fabricated in step 1050 are subjected to an operation test, a durability test, and the like. Through these steps, the semiconductor devices are completed and shipped (step 1070). FIG. 10 shows a detailed flow of the wafer process described above. In step 1110 (oxidation), the surface of the wafer is oxidized. In step 1120. (CVD), an insulating film is formed on the wafer surface. In step 1130 (electrode formation), electrodes are formed on the wafer by vapor deposition. In step 1140 (ion implantation), ions are implanted into the wafer. In step 1150 (resist processing), the wafer is coated with a resist. In step 1160 (exposure), the mask circuit pattern is transferred and exposed in a plurality of shot regions on the mask by the exposure apparatus or exposure method described above. In step 1170 (development), the exposed wafer is developed. In step 1180 (etching), portions other than the developed resist image are etched away. In step 1190 (resist removal), unnecessary resist remaining after the etching is removed. By repeating these steps, multiple circuit patterns are formed on the wafer. When the fabrication method of this embodiment is used, large devices which are conventionally difficult to fabricate can be fabricated at low cost.

As has been described above, alignment marks of desired partial transfer masks are previously designated, and the positions of these designated alignment marks of the designated partial transfer patterns are measured. On the basis of the measured positions, functions for determining the positions of the partial transfer patterns are determined. Furthermore, transfer magnifications are also calculated on the basis of the alignment mark positions. By using these functions and transfer magnifications, the partial transfer patterns are transferred to an object of transfer. This makes high-accuracy stitching feasible while maintaining high throughput. Additionally, the throughput can be further improved by continuously scanning the transfer masks and the object relative to each other in the scanning exposure step.

The present invention is not limited to the above embodiments and various changes and modifications can be made within the spirit and scope of the present invention. Therefore, to apprise the public of the scope of the present invention the following claims are made.

What is claimed is:

1. A transfer apparatus for transferring a pattern of a mask, the pattern being divided into a plurality of partial patterns which are transferred onto a substrate, and the mask having a plurality of alignment marks for specifying positions of the plurality of partial patterns, said apparatus comprising:

a measuring device for measuring positions of all or some of the plurality of alignment marks; and a controller for determining a function indicating an arrangement of the plurality of partial patterns on the basis of the measurements by said measuring device and aligning the mask and the substrate in accordance with the function.

2. The apparatus according to claim 1, wherein said controller determines a function indicating an arrangement of partial patterns belonging to each mask stripe composed of a plurality of partial patterns arranged in a direction in which the mask and the substrate are moved relative to each other.

3. The apparatus according to claim 2, wherein said controller continuously aligns the mask and the substrate while continuously moving the mask and the substrate in synchronism with each other.

4. A transfer apparatus for transferring a pattern of a mask, the pattern being divided into a plurality of partial patterns which are transferred onto a substrate, and the mask having a plurality of alignment marks for specifying positions of the plurality of partial patterns, said apparatus comprising:

a measuring device for measuring positions of all or some of the plurality of alignment marks; and a controller for determining a function indicating an arrangement of the plurality of partial patterns on the basis of the measurements by said measuring device and aligning the mask and the substrate in accordance with the function, wherein said controller comprises:

a calculating unit for calculating a ratio of a size of an actual pattern to a size of a designed pattern on the basis of the measurements by said measuring device; and a correcting unit for correcting a difference of the size of the actual pattern from the size of the designed pattern.

5. The apparatus according to claim 4, wherein said calculating unit calculates a ratio of a length of the actual pattern to a length of the designed pattern in the direction in which the mask and the substrate are moved relative to each other.

6. The apparatus according to claim 5, wherein said correcting unit adjusts a speed at which the mask is moved on the basis of the calculated ratio, thereby correcting a difference of the length of the actual pattern from the length of the designed pattern.

7. The apparatus according to claim 4, wherein said calculating unit calculates a first ratio of a length of the actual pattern to a length of the designed pattern in a first direction in which the mark and the substrate are moved relative to each other, and a second ratio of a length of the actual pattern to a length of the designed pattern in a second direction perpendicular to the first direction.

8. The apparatus according to claim 7, wherein said correcting unit corrects differences of the lengths of the actual pattern from the lengths of the designed pattern in the first and second directions on the basis of the first and second ratios.

9. A transfer apparatus for transferring a pattern of a mask while moving the mask and a substrate relative to each other, the pattern being divided into a plurality of partial patterns which are transferred onto a substrate, and the mask having a plurality of alignment marks for specifying positions of the plurality of partial patterns, said apparatus comprising:

a measuring device for measuring positions of all or some of the plurality of alignment marks; and a controller for determining a function indicating an arrangement of the plurality of partial patterns on the basis of the measurements by said measuring device and, during transfer, moving the mask and the substrate relative to each other while aligning a partial pattern to be transferred and the substrate in accordance with the function, wherein said controller comprises:

a calculating unit for calculating a ratio of a size of an actual mask stripe, composed of a plurality of partial patterns arranged in a direction in which the mask and the substrate are moved relative to each other, to a size of a designed mask stripe, on the basis of the measurements by said measuring device; and a correcting unit for correcting a difference of the size of the actual mask stripe from the size of the designed mask stripe, when the mask and the substrate are moved relative to each other, on the basis of the calculation by said calculating unit.

10. The apparatus according to claim 9, wherein said calculating unit calculates a ratio of a length of the actual mask stripe to a length of the designed mask stripe in the direction in which the mask and the substrate are moved relative to each other.

11. The apparatus according to claim 10, wherein said correcting unit adjusts a speed at which the mask is moved on the basis of the calculated ratio, thereby correcting a difference of the length of the actual mask stripe from the length of the designed mask stripe.

12. The apparatus according to claim 9, wherein said calculating unit calculates a first ratio of a length of the actual mask stripe to a length of the designed mask stripe in a first direction in which the mask and the substrate are moved relative to each other, and a second ratio of a length of the actual mask stripe to a length of the designed mask stripe in a second direction perpendicular to the first direction.

13. The apparatus according to claim 12, wherein said correcting unit corrects differences of the lengths of the actual mask stripe from the lengths of the designed mask stripe in the first and second directions on the basis of the first and second ratios.

14. The apparatus according to claim 1, wherein said controller calculates a position of the mask at the start of transfer on the basis of the function, and controls the position of the mask on the basis of the calculation.

15. The apparatus according to claim 1, wherein an operation of transferring a plurality of partial patterns, belonging to each mask stripe composed of a plurality of partial patterns arranged in a direction in which the mask and the substrate are moved relative to each other, is successively executed in units of mask stripes under the control of said controller.

16. The apparatus according to claim 15, further comprising:

an irradiating unit for irradiating the mask with a charged particle beam;

a mask stage for mounting the mask;

a deflector for deflecting the charged particle beam passing through the mask; and a substrate stage for mounting the substrate,
wherein when a plurality of partial patterns belonging to one mask stripe are to be successively transferred onto the substrate, said controller continuously drives said mask stage and said substrate stage and controls said deflector such that an image transferred onto the substrate by using one partial pattern and an image transferred onto the substrate by using the next partial pattern are accurately stitched together.

17. The apparatus according to claim 16, wherein when a plurality of partial patterns belonging to one mask stripe are to be successively transferred onto the substrate, said controller linearly continuously drives said mask stage and said substrate stage and controls said deflector in accordance with the function.

18. The apparatus according to claim 1, further comprising:

an irradiating unit for irradiating the mask with a charged particle beam;

a mask stage for mounting the mask;

a deflector for deflecting the charged particle beam passing through the mask; and a substrate stage for mounting the substrate.

19. The apparatus according to claim 18, wherein said irradiating unit irradiates the mask with a charged particle beam shaped to have an arcuate section.

20. A transfer method of transferring a pattern of a mask, the pattern being divided into a plurality of partial patterns which are transferred onto a substrate, and the mask having a plurality of alignment marks for specifying positions of the plurality of partial patterns, said method comprising:

a measurement step of measuring positions of all or some of the plurality of alignment marks; and a control step of determining a function indicating an arrangement of the plurality of partial patterns on the basis of the measurements in the measurement step and aligning the mask and the substrate in accordance with the function.

21. The method according to claim 20, wherein the control step comprises determining a function indicating an arrangement of partial patterns belonging to each mask stripe composed of a plurality of partial patterns arranged in a direction in which the mask and the substrate are moved relative to each other.

22. The method according to claim 21, wherein said control step comprises continuously aligning the mask and the substrate while continuously moving the mask and the substrate in synchronism with each other.

23. A transfer method of transferring a pattern of a mask, the pattern being divided into a plurality of partial patterns which are transferred onto a substrate, and the mask having a plurality of alignment marks for specifying positions of the plurality of partial patterns, said method comprising:

a measurement step of measuring positions of all or some of the plurality of alignment marks; and a control step of determining a function indicating an arrangement of the plurality of partial patterns on the basis of the measurements in the measurement step and aligning the mask and the substrate in accordance with the function, wherein the control step comprises:

a calculation step of calculating a ratio of a size of an actual pattern to a size of a designed pattern on the basis of the measurements in the measurement step; and a correction step of correcting a difference of the size of the actual pattern from the size of the designed pattern.

24. The method according to claim 23, wherein the calculation step comprises calculating a ratio of a length of the actual pattern to a length of the designed pattern in the direction in which the mask and the substrate are moved relative to each other.

25. The method according to claim 24, wherein the correction step comprises adjusting a speed at which the mask is moved on the basis of the calculated ratio, thereby correcting a difference of the length of the actual pattern from the length of the designed pattern.

26. The method according to claim 23, wherein the calculation step comprises calculating a first ratio of a length of the actual pattern to a length of the designed pattern in a first direction in which the mask and the substrate are moved relative to each other, and a second ratio of a length of the actual pattern to a length of the designed pattern in a second direction perpendicular to the first direction.

27. The method according to claim 26, wherein the correction step comprises correcting differences of the lengths of the actual pattern from the lengths of the designed pattern in the first and second directions on the basis of the first and second ratios.

28. A transfer method of transferring a pattern of a mask while moving the mask and a substrate relative to each other, the pattern being divided into a plurality of partial patterns which are transferred onto a substrate, and the mask having a plurality of alignment marks for specifying positions of the plurality of partial patterns, said method comprising:

a measurement step of measuring positions of all or some of the plurality of alignment marks; and a control step of determining a function indicating an arrangement of the plurality of partial patterns on the basis of the measurements in the measurement step and, during transfer, moving the mask and the substrate relative to each other while aligning a partial pattern to be transferred and the substrate in accordance with the function, wherein the control step comprises:

a calculation step of calculating a ratio of a size of an actual mask stripe, composed of a plurality of partial patterns arranged in a direction in which the mask and the substrate are moved relative to each other, to a size of a designed mask stripe, on the basis of the measurements in the measurement step; and a correction step of correcting a difference of the size of the actual mask stripe from the size of the designed mask stripe, when the mask and the substrate are moved relative to each other, on the basis of the calculation in the calculation step.

29. The method according to claim 28, wherein the calculation step comprises calculating a ratio of a length of the actual mask stripe to a length of the designed mask stripe in the direction in which the mask and the substrate are moved relative to each other.

30. The method according to claim 29, wherein the correction step comprises adjusting a speed at which the mask is moved on the basis of the calculated ratio, thereby correcting a difference of the length of the actual mask stripe from the length of the designed mask stripe.

31. The method according to claim 28, wherein the calculation step comprises calculating a first ratio of a length of the actual mask stripe to a length of the designed mask stripe in a first direction in which the mask and the substrate are moved relative to each other, and a second ratio of a length of the actual mask stripe to a length of the designed mask stripe in a second direction perpendicular to the first direction.

32. The method according to claim 31, wherein the correction step comprises correcting differences of the lengths of the actual mask stripe from the lengths of the designed mask stripe in the first and second directions on the basis of the first and second ratios.

33. The method according to claim 20, wherein the control step comprises calculating a position of the mask at the start of transfer on the basis of the function, and controls the position of the mask on the basis of the calculation.

34. The method according to claim 20, wherein an operation of transferring a plurality of partial patterns, belonging to each mask stripe composed of a plurality of partial patterns arranged in a direction in which the mask and the substrate are moved relative to each other, is successively executed in units of mask stripes under the control of the control step.

35. The method according to claim 34, wherein said transfer method is applied to a transfer apparatus comprising:
an irradiating unit for irradiating the mask with a charged particle beam;
a mask stage for mounting the mask;
a deflector for deflecting the charged particle beam passing through the mask; and
a substrate stage for mounting the substrate, and
when a plurality of partial patterns belonging to one mask stripe are to be successively transferred onto the substrate, the control step comprises continuously driving said mask stage and said substrate stage and controlling said deflector such that an image transferred onto the substrate by using one partial pattern and an image transferred onto the substrate by using the next partial pattern are accurately stitched together.

36. The method according to claim 35, wherein when a plurality of partial patterns belonging to one mask stripe are to be successively transferred onto the substrate, the control step comprises linearly continuously driving said mask stage and said substrate stage and controlling said deflector in accordance with the function.

37. The method according to claim 20, wherein said transfer method is applied to a transfer apparatus comprising:
an irradiating unit for irradiating the mask with a charged particle beam;
a mask stage for mounting the mask;
a deflector for deflecting the charged particle beam passing through the mask; and
a substrate stage for mounting the substrate.

38. The method according to claim 37, wherein said irradiating unit irradiates the mask with a charged particle beam shaped to have an arcuate section.

39. A device fabrication method in which a transfer method of transferring a pattern of a mask is applied to a lithography step,
wherein the pattern is divided into a plurality of partial patterns which are transferred onto a sbustrate, the mask has a plurality of alignment marks for specifying positions of the plurality of partial patterns, and
said transfer method comprises:
a measurement step of measuring positions of all or some of the plurality of alignment marks; and
a control step of determining a function indicating an arrangement of the plurality of partial patterns on the basis of the measurements in the measurement step and aligning the mask and the substrate in accordance with the function.

40. A transfer apparatus for irradiating a mask having partial patterns with a charged particle beam from a beam source to transfer images of the partial patterns onto a substrate, the partial patterns being formed by dividing a pattern and arranged on the mask, said apparatus comprising:
a measuring device arranged to measure positions of all or some of a plurality of alignment marks for the partial patterns; and
a controller arranged to calculate a function for determining positions of the partial patterns based upon the position information measured by said measurement device and to adjust at least one of a position of the mask relative to the charged particle beam and a position of the substrate relative to the image of each of the partial patterns.

41. A transfer apparatus for scanning a pattern of a mask with a charged particle beam from a beam source to transfer an image of the pattern onto a substrate with the charged particle beam from the mask, said apparatus comprising:
a measuring device arranged to measure positions of all or some of a plurality of alignment marks for the pattern; and
a controller arranged to calculate a function for determining a shape of the pattern based upon the position information measured by said measurement device and to adjust, during the scanning of the pattern, at least one of a position of the mask relative to the charged particle beam and a position of the substrate relative to the image of the pattern.

\* \* \* \* \*

UNITED STATES PATENT AND TRADEMARK OFFICE
CERTIFICATE OF CORRECTION

PATENT NO.     : 6,466,301 B1                                   Page 1 of 1
DATED          : October 15, 2002
INVENTOR(S)    : Yoshikiyo Yui et al.

It is certified that error appears in the above-identified patent and that said Letters Patent is hereby corrected as shown below:

Column 1,
Line 50, "exposure" should read -- an exposure --.

Column 4,
Line 25, "or" should read -- for --.

Column 7,
Line 7, "$3a$ 1, $3a$ 2, $3a$ 5" should read -- $3a1, 3a2, 3a5$ --.
Line 47, "$3a$ 5" should read -- $3a5$ --.
Line 48, "$3a$ 2, $3a$ 3," should read -- $3a2, 3a3$, --.

Column 8,
Line 12, "error least square" should read -- determining error using least squares --.
Line 21, "$3a$ 2" should read -- $3a2$ --.

Column 9,
Line 14, "a is" should read -- $\underline{n}$ is --.

Column 10,
Line 40, "$3a$ 3" should read -- $3a3$ --.

Column 13,
Line 13, "-direction" should read -- direction --.
Line 49, "def lectors" should read -- deflectors --.

Column 14,
Line 10, following "function." the right margin should be closed up.
Line 11, before "However," the left margin should be closed up.

Signed and Sealed this

Eighteenth Day of March, 2003

JAMES E. ROGAN
*Director of the United States Patent and Trademark Office*